(12) United States Patent
Kumaki et al.

(10) Patent No.: US 8,878,159 B2
(45) Date of Patent: *Nov. 4, 2014

(54) LIGHT-EMITTING ELEMENT AND LIGHT-EMITTING DEVICE

(75) Inventors: Daisuke Kumaki, Nigata (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 41 days.

This patent is subject to a terminal disclaimer.

(21) Appl. No.: 13/155,693

(22) Filed: Jun. 8, 2011

(65) Prior Publication Data

US 2011/0233597 A1    Sep. 29, 2011

Related U.S. Application Data

(63) Continuation of application No. 10/573,929, filed as application No. PCT/JP2005/018243 on Sep. 27, 2005, now Pat. No. 7,964,864.

(30) Foreign Application Priority Data

Sep. 30, 2004   (JP) .................................. 2004-285777

(51) Int. Cl.
  *H01L 29/06*   (2006.01)
  *H01L 51/52*   (2006.01)
  *H01L 27/32*   (2006.01)
  *H01L 51/50*   (2006.01)

(52) U.S. Cl.
  CPC ....... *H01L 51/5203* (2013.01); *H01L 2251/558* (2013.01); *H01L 51/5265* (2013.01); *H01L 27/3244* (2013.01); *H01L 51/5048* (2013.01)
  USPC ........... 257/13; 257/40; 257/79; 257/E39.007

(58) Field of Classification Search
  USPC ................................. 257/13, 40, 79, E39.007
  See application file for complete search history.

(56) References Cited

U.S. PATENT DOCUMENTS 5,703,436 A  12/1997 Forrest et al.
6,107,734 A   8/2000 Tanaka et al.
(Continued)

FOREIGN PATENT DOCUMENTS

CN    1498049 A     5/2004
EP    1 351 558 A1  11/1999
(Continued)

OTHER PUBLICATIONS

Office Action re Chinese application No. CN 200580033393.5, dated Jul. 8, 2011 (with English translation).

(Continued)

*Primary Examiner* — Phat X Cao
(74) *Attorney, Agent, or Firm* — Husch Blackwell LLP

(57) ABSTRACT

It is an object of the present invention to provide a light-emitting element having a layer containing a light-emitting material and a transparent conductive film between a pair of electrodes, in which electric erosion of the transparent conductive film and metal can be prevented, and also to provide a light-emitting device using the light-emitting element. According to one feature of the invention, a light-emitting element includes a first layer 102 containing a light-emitting material, a second layer 103 containing a material having a donor level, a third layer 104 including a transparent conductive film, and a fourth layer 105 containing a hole-transporting medium between a first electrode 101 and a second electrode 106, in which the first layer 102, the second layer 103, the third layer 104, the fourth layer 105, and the second electrode 106 are provided sequentially, in which the second electrode 106 has a layer containing metal.

23 Claims, 10 Drawing Sheets

(56) References Cited

U.S. PATENT DOCUMENTS

| | | |
|---|---|---|
| 6,614,176 B2 | 9/2003 | Kim et al. |
| 6,717,358 B1 | 4/2004 | Liao et al. |
| 6,720,092 B2 | 4/2004 | Hatwar |
| 6,734,457 B2 | 5/2004 | Yamazaki et al. |
| 6,765,349 B2 | 7/2004 | Liao et al. |
| 6,844,672 B2 | 1/2005 | Yamazaki |
| 6,876,144 B2 | 4/2005 | Peng |
| 7,247,512 B2 | 7/2007 | Yamazaki |
| 7,273,663 B2 | 9/2007 | Liao et al. |
| 7,365,486 B2 | 4/2008 | Lee et al. |
| 7,462,883 B2 | 12/2008 | Kumaki et al. |
| 7,964,864 B2 * | 6/2011 | Kumaki et al. ............ 257/13 |
| 2002/0134984 A1 | 9/2002 | Igarashi |
| 2002/0153243 A1 | 10/2002 | Forrest et al. |
| 2003/0048072 A1 | 3/2003 | Ishihara et al. |
| 2003/0127967 A1 | 7/2003 | Tsutsui et al. |
| 2003/0189401 A1 | 10/2003 | Kido et al. |
| 2004/0004215 A1 | 1/2004 | Iechi et al. |
| 2004/0022664 A1 | 2/2004 | Kubota et al. |
| 2005/0098207 A1 | 5/2005 | Matsumoto et al. |
| 2005/0156197 A1 | 7/2005 | Tsutsui et al. |
| 2006/0124920 A1 | 6/2006 | Kimura |
| 2007/0090376 A1 | 4/2007 | Kumaki et al. |
| 2007/0114512 A1 | 5/2007 | Kumaki et al. |
| 2007/0114527 A1 | 5/2007 | Kumaki et al. |
| 2007/0114544 A1 | 5/2007 | Kumaki et al. |
| 2007/0182317 A1 | 8/2007 | Kido et al. |
| 2009/0079342 A1 | 3/2009 | Kumaki et al. |
| 2011/0156029 A1 | 6/2011 | Kumaki et al. |

FOREIGN PATENT DOCUMENTS

| | | |
|---|---|---|
| EP | 1 318 553 A2 | 6/2003 |
| EP | 1 408 563 A2 | 4/2004 |
| EP | 1 530 245 A2 | 5/2005 |
| GB | 2 417 827 A | 3/2006 |
| JP | 3-210791 | 9/1991 |
| JP | 11-329748 | 11/1999 |
| JP | 2000-215984 | 8/2000 |
| JP | 2000-340365 | 12/2000 |
| JP | 2003-45676 | 2/2003 |
| JP | 2003-89864 | 3/2003 |
| JP | 2003-92191 | 3/2003 |
| JP | 2003-264085 | 9/2003 |
| JP | 2003-272855 | 9/2003 |
| JP | 2003-272860 | 9/2003 |
| JP | 2004-281371 | 10/2004 |
| JP | 2005-166637 | 6/2005 |
| JP | 2005-251587 | 9/2005 |
| KR | 10-2004-0032765 | 4/2004 |

OTHER PUBLICATIONS

Office Action re Korean application No. KR 10-2007-7009887, dated Oct. 31, 2011 (with English translation).

Tang, C.W., "Two-Layer Organic Photovoltaic Cell," Applied Physics Letters, vol. 48, No. 2, Jan. 13, 1986, pp. 183-185.

Pfeiffer, M. et al., "33.3: Invited Paper: OLEDs with Doped Transport Layers for Highly Efficient Displays," SID Digest '03: SID International Symposium Digest of Technical Papers, vol. 34, May 20, 2003, pp. 1076-1079.

International Search Report re application No. PCT/JP2005/014462, dated Nov. 1, 2005.

Written Opinion re application No. PCT/JP2005/014462, dated Nov. 1, 2005.

International Search Report re application No. PCT/JP2005/018243, dated Nov. 8, 2005.

Written Opinion re application No. PCT/JP2005/018243, dated Nov. 8, 2005.

Search Report re European Application No. EP 05768584.4, dated Jun. 7, 2010.

* cited by examiner

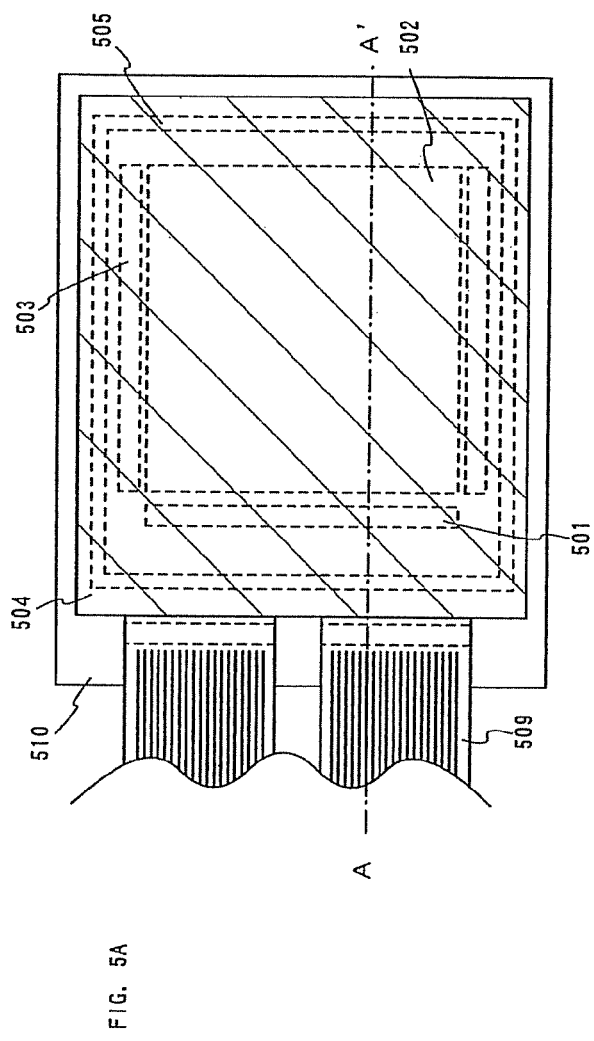
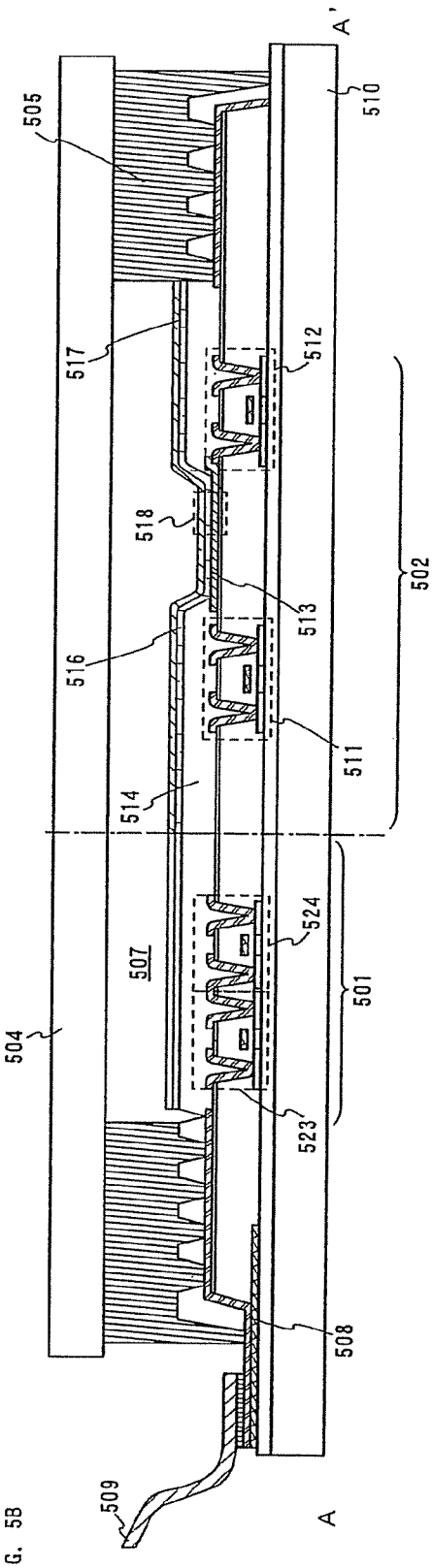
FIG. 5A
FIG. 5B

US 8,878,159 B2

LIGHT-EMITTING ELEMENT AND LIGHT-EMITTING DEVICE

This application is a continuation of U.S. application Ser. No. 10/573,929, filed on Mar. 30, 2006 now U.S. Pat. No. 7,964,864.

TECHNICAL FIELD

The present invention relates to a light-emitting element having a pair of electrodes and a layer containing an organic compound capable of emitting light by applying an electric field thereto. The invention further relates to a light-emitting device having such a light-emitting element.

BACKGROUND ART

A light-emitting element using a light-emitting material has advantages of thinness and lightweight, high-speed response, DC low-voltage drive, and the like and is expected to be applied to a next-generation flat panel display. In addition, it is said that a light-emitting device having light-emitting elements disposed in matrix is superior to a conventional liquid crystal display device in a wide viewing angle and high visibility.

A light-emitting element is said to have the following light-emission mechanism: voltage is applied to a light-emitting layer sandwiched between a pair of electrodes, electrons injected from a second electrode and holes injected from a first electrode are recombined in a light-emission center of the light-emitting layer to form molecular excitons, and then light is emitted by releasing energy when the molecular exciton returns to the ground state. A singlet excited state and a triplet excited state are each known as the excited state and the light emission is considered possible via any one of the excited states.

In order to enhance the characteristic of such a light-emitting element, the improvement of the element structure, the development of the material, or the like is performed.

For example, a method in which an optical length L from a light-emitting portion to a reflective electrode is controlled by sandwiching ITO between the light-emitting portion and a reflective metal is given as a means for increasing the external quantum efficiency without deteriorating the luminance by controlling the distance from the light-emitting region to the reflective metal (see, for example, Reference 1: Japanese Patent Application Laid-Open No.: 2003-272855).

FIG. 2 schematically shows an element structure disclosed in Reference 1. In this structure, a transparent electrode 201, a light-emitting portion 202, a transparent conductive film 203, and a metal electrode 204 are stacked. By adjusting the thickness of the transparent conductive film 203, the optical length L from the light-emitting portion to the metal electrode is optimized to increase the external quantum efficiency.

However, according to the structure disclosed in Reference 1, since the transparent conductive film 203 and the reflective metal (metal electrode) 204 are in contact, there is a problem of erosion. Here, it is known that the erosion might occur due to the difference in their self-potential or the like, and also the erosion is referred to as electric erosion (see, for example, Reference 2: Japanese Patent Application Laid-Open No.: 2003-89864). Reference 2 describes the self-potential measured using a sodium chloride solution of 3.5% (liquid-temperature of 27° C.) and using silver/silver-chloride as a reference electrode. In the case of such a measurement, the self-potential of aluminum known as metal having high reflectivity is approximately −1550 mV, while that of ITO serving as a transparent conductive film ($In_2O_3$ containing $SnO_2$ by 10 wt %) is approximately −1000 mV. Thus, the difference between these self-potentials of aluminum and ITO is large. Therefore, when aluminum and ITO are stacked to be in contact with each other, it is very likely that oxidation-reduction reaction progresses at a stacked interface between aluminum and ITO, which highly results in electric erosion. Such a problem of electric erosion is generated regardless of the combination of ITO and aluminum.

The self-potential is potential of a reaction to a reference electrode when the reaction is soaked in a certain solution in such a state that current is not applied from outside, that is, potential in a closed loop and is also referred to as resting potential.

DISCLOSURE OF INVENTION

In view of the above problems, it is an object of the present invention to provide a light-emitting element having a layer containing a light-emitting material and a transparent conductive film between a pair of electrodes, in which electric erosion of the transparent conductive film and metal can be prevented. Moreover, it is an object of the invention to provide a light-emitting device using the light-emitting element.

According to one structure of a light-emitting element according to the invention to solve the above problems, the light-emitting element includes a first layer containing a light-emitting material, a second layer containing an organic compound and an electron-supplying material, a third layer including a transparent conductive film, and a fourth layer containing a hole-transporting medium between a first electrode and a second electrode, in which the first layer containing a light-emitting material, the second layer containing an organic compound and an electron-supplying material, the third layer including a transparent conductive film, the fourth layer containing a hole-transporting medium, and the second electrode are provided sequentially, in which the second electrode has a layer containing metal.

According to another structure of a light-emitting element according to the invention to solve the above problems; the light-emitting element includes a first layer containing a light-emitting material, a second layer containing an organic compound and an electron-supplying material, a third layer including a transparent conductive film, and a fourth layer containing a hole-transporting medium between a first electrode and a second electrode including metal, in which the first layer containing a light-emitting material, the second layer containing an organic compound and an electron-supplying material, the third layer including a transparent conductive film, the fourth layer containing a hole-transporting medium, and the second electrode are provided sequentially.

According to another structure of a light-emitting element according to the invention to solve the above problems, a light-emitting device using the light-emitting element includes a first layer containing a light-emitting material, a second layer containing a material having a donor level, a third layer including a transparent conductive film, and a fourth layer containing a hole-transporting medium between a first electrode and a second electrode, in which the first layer containing a light-emitting material, the second layer containing a material having a donor level, the third layer including a transparent conductive film, the fourth layer containing a hole-transporting medium, and the second electrode are provided sequentially, in which the second electrode has a layer containing metal.

According to another structure of a light-emitting element according to the invention to solve the above problems, the light-emitting element includes a first layer containing a light-emitting material, a second layer containing a material having a donor level, a third layer including a transparent conductive film, and a fourth layer containing a hole-transporting medium between a first electrode and a second electrode including metal, in which the first layer containing a light-emitting material, the second layer containing a material having a donor level, the third layer including a transparent conductive film, the fourth layer containing a hole-transporting medium, and the second electrode are provided sequentially.

In the above structure, each of the second layer containing an organic compound and an electron-supplying material and the fourth layer containing a hole-transporting medium may be formed in either a single-layer structure or a multilayer structure where a plurality of layers is stacked. Here, the organic compound is preferably an organic compound having electron transportability and, particularly a metal complex having a ligand including a $\pi$-conjugated skeleton. The electron-supplying material is preferably alkaline metal, alkaline earth metal, or rare-earth metal.

In the above structure, the second electrode may be formed with reflective metal in a single-layer structure or may be formed by stacking reflective metal and another electrode material.

With the structure of the invention, metal and a transparent conductive film are not in direct contact; therefore, the electric erosion due to the difference in the self-potentials or the like can be prevented.

BRIEF DESCRIPTION OF DRAWINGS

In the accompanying drawings:

FIGS. 5A and 5B are views each explaining a light-emitting device;

BEST MODE FOR CARRYING OUT THE INVENTION

Embodiment Mode and Embodiments of the present invention are hereinafter described with reference to the drawings. However, the invention is not limited to the following description. It is to be understood by those skilled in the art that the modes and details of the invention can be changed and modified without departing from the scope of the invention. Therefore, the invention is not limited to the description of the following Embodiment Mode and Embodiments.

Embodiment Mode

Figure 1:
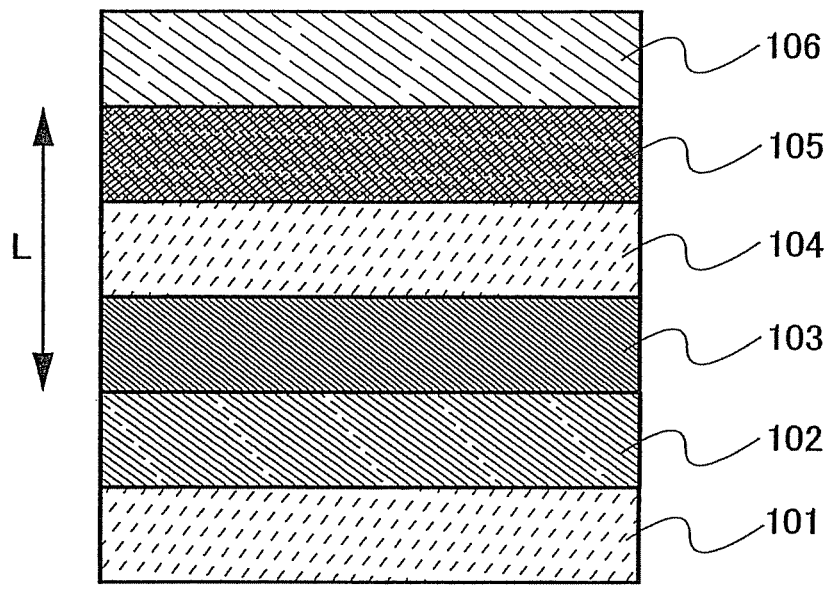
FIG. 1 is a diagram explaining an element structure of a light-emitting element according to a certain aspect of the present invention.
Figure 2:
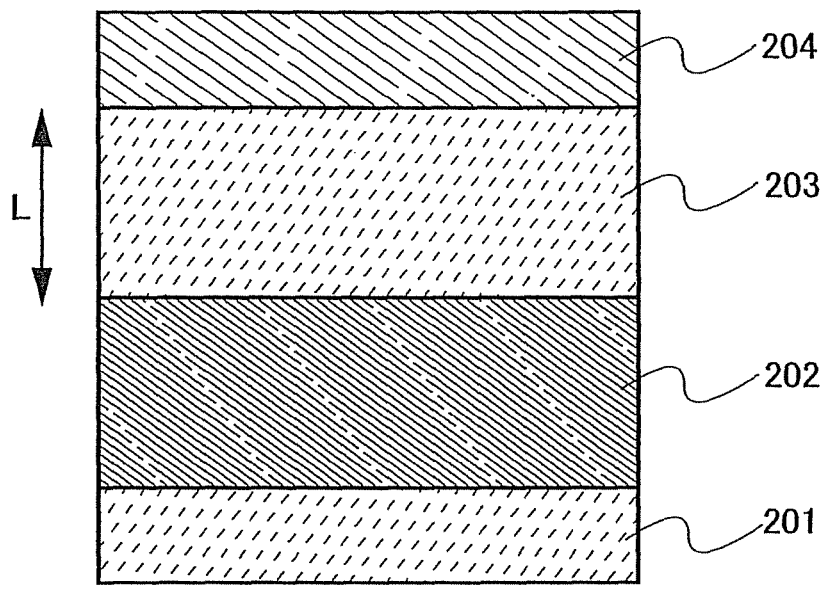
FIG. 2 is a diagram explaining an element structure of a conventional light-emitting element.

FIG. 1 schematically shows an element structure of a light-emitting element in the present invention. In the light-emitting element of the invention, a first layer 102, a second layer 103, a third layer 104, and a fourth layer 105 are provided between a first electrode 101 and a second electrode 106 in order from the first electrode 101 toward the second electrode 106.

In this embodiment mode, the second electrode 106 is formed with metal, and light emitted from the first layer 102 is extracted from the first electrode side. Light can be emitted by applying higher potential to the first electrode 101 than that of the second electrode 106.

The first electrode 101 is preferably formed with a light-transmitting material, specifically indium tin oxide (ITO), indium tin oxide containing silicon oxide (ITS % zinc oxide (ZnO), indium oxide containing zinc oxide by 2% to 20% (IZO), zinc oxide containing gallium (GZO), tin oxide ($SnO_2$), indium oxide ($In_2O_3$), or the like.

The first layer 102 is a layer containing a light-emitting material and is formed with a known material. The first layer 102 may be formed in either a single-layer structure or a multilayer structure. For example, not only the light-emitting layer but also each of a functional layer such as an electron-injecting layer, an electron-transporting layer, a hole-blocking layer, a hole-transporting layer, a hole-injecting layer, or the like may be freely combined and provided as the first layer 102. Moreover, a mixed layer or mixed junction in which each of these layers is mixed may be formed. The layer structure of the light-emitting layer is changeable. Such modification as providing an electrode for the electron injection and combining this function in an electron-transporting region instead of the particular electron-injecting region is allowable within the scope of the invention.

The second layer 103 contains a material having a donor level. Specifically, it is sufficient that the second layer 103 consists of or contains an n-type semiconductor such as zinc oxide, tin oxide, titanium oxide, zinc sulfide, zinc selenide, or zinc telluride. Alternatively, the second layer 103 may have a structure doped with an electron-supplying material to an organic compound. The organic compound here is preferably an electron-transporting material such as 2-(4-biphenylyl)-5-(4-tert-butylphenyl)-1,3,4-oxadiazole (abbreviated to PBD), OXD-7, TAZ, p-EtTAZ, BPhen, or BCP. Besides, a metal complex having a quinoline skeleton or benzoquinoline skeleton in which the drive voltage has been conventionally increased, such as $Alq_3$, tris(4-methyl-8-quinolinolato)aluminum (abbreviated to $Almq_3$), or bis(10-hydroxybenzo[h]-quinolinato)beryllium (abbreviated to $BeBq_2$), or bis(2-methyl-8-quinolinolato)-4-phenylphenolato-aluminum (abbreviated to BAlq) is given. On the other hand, the electron-supplying material is, for example, alkali metal such as Li or Cs, Mg, alkali-earth metal such as Ca, Sr, or Ba, or rare-earth metal such as Er or Yb. In addition, for example, in the case of using to $Alq_3$ as an organic compound, an organic compound having electron-supplying properties such as tetrathiafulvalene or tetra methyl thiafulvalene may also be doped as an electron-supplying material to $Alq_3$. Moreover, metal oxide such as molybdenum oxide, vanadium oxide, rhenium oxide, zinc oxide, tin oxide, or titanium oxide may be mixed in a structure in which an electron-supplying material is doped into an organic compound.

A layer containing a plurality of materials such as the layer including the material doped with an electron-supplying material to an organic compound can be formed by depositing each material simultaneously. The layer containing a plurality of materials is desirably formed by combining the same kinds of methods or the different kinds of methods such as a co-evaporation method with resistance heating evaporation methods, a co-evaporation method with electron beam evaporation methods, a co-evaporation method with a resistance heating evaporation method and an electron beam evaporation method, deposition with a resistance heating evaporation method and a sputtering method, or deposition with an electron beam evaporation method and a sputtering method. In addition, although a layer containing two kinds of materials are assumed in the above examples, the layer containing a plurality of materials can be similarly formed in the case of containing three or more kinds of materials.

The third layer 104 has light-transmitting properties and contains a carrier-generating material. Specifically, a transparent conductive film such as indium tin oxide (ITO), indium tin oxide containing silicon oxide (ITSO), zinc oxide (ZnO), indium oxide containing zinc oxide by 2% to 20% (IZO), zinc oxide containing gallium (GZO), tin oxide ($SnO_2$), indium oxide ($In_2O_3$), metal oxide such as molybdenum oxide ($MoO_x$) and the mixture thereof, or metal or alloy thinned enough to have light-transmitting properties (for example, aluminum, silver, or the like) can be used. When the metal thinned enough to have light-transmitting properties is used as the transparent conductive film, the invention is applied in the case of a material different from the first electrode.

The fourth layer 105 contains a hole-transporting medium. The hole-transporting medium is, for example, a hole-transporting material containing an organic compound, a material doped with an electron-receiving material to an organic compound, or a hole-transporting material containing an inorganic compound. The fourth layer 105 can be formed with these hole-transporting mediums, and it is preferable to use a material having an acceptor level for generating holes, that is, a material doped with an electron-receiving material to an organic compound or a hole-transporting material containing an inorganic compound.

When the fourth layer contains a hole-transporting material containing an organic compound, the hole-transporting material to be used is preferably a material having an aromatic-amine skeleton (that is, a compound having a bond of a benzene ring-nitrogen). For example, the following material is widely used: N,N'-bis(3-methylphenyl)-N,N'-diphenyl-[1,1'-biphenyl]-4,4'-diamine (abbreviated to TPD), a derivative thereof such as 4,4'-bis[N-(1-naphtyl)-N-phenyl-amino]-biphenyl (abbreviated to α-NPD), or a starburst aromatic amine compound such as 4,4',4''-tris(N-carbazolyl)-triphenylamine (abbreviated to TCTA), 4,4',4''-tris(N,N-diphenyl-amino)-triphenylamine (abbreviated to TDATA), or 4,4',4''-tris[(N-(3-methylphenyl)-N-phenyl-amino]triphenylamine (abbreviated to MTDATA).

Moreover, when the fourth layer 105 has a structure doped with a material having electron-receiving properties to an organic compound, the organic compound to be used is preferably a hole-transporting material, and a material having an aromatic-amine skeleton is preferred. For example, in addition to TPD, α-NPD (derivative of TPD) or a starburst aromatic amine compound such as TDATA or MTDATA is given. On the other hand, for example, metal oxide having electron-receiving properties to α-NPD, such as molybdenum oxide, vanadium oxide, or rhenium oxide is given as the electron-receiving material. Moreover, another organic compound having electron-receiving properties to α-NPD such as tetracyanoquinodimethane (abbreviated to TCNQ) or 2,3-dicyanonaphthoquinone (abbreviated to DCNNQ) may also be used.

A layer containing a plurality of materials such as the structure including the material doped with an electron-receiving material to an organic compound can be formed by depositing each material simultaneously. The layer containing a plurality of materials is desirably formed by combining the same kinds of methods or the different kinds of methods such as a co-evaporation method with resistance heating evaporation methods, a co-evaporation method with electron beam evaporation methods, a co-evaporation method with a resistance heating evaporation method and an electron beam evaporation method, deposition with a resistance heating evaporation method and a sputtering method, or deposition with an electron beam evaporation method and a sputtering method. In addition, although a layer containing two kinds of materials are assumed in the above examples, the layer containing a plurality of materials can be similarly formed in the case of containing three or more kinds of materials.

When the fourth layer 105 contains a hole-transporting material containing an inorganic compound, it is sufficient that the fourth layer 105 consists of or contains a p-type semiconductor such as vanadium oxide, chromium oxide, molybdenum Oxide, cobalt oxide, or nickel oxide. Note that the fourth layer 105 is made to be formed with a material different from that used for the third layer 104.

The second electrode 106 is preferably formed with metal having high reflectivity. For example, aluminum (Al), silver (Ag), or an alloy containing Al or Ag such as an AlLi alloy or an MgAg alloy can be used. In addition, the second electrode 106 may be formed in a multilayer structure of reflective metal and another electrode material. The electron injectability can be increased by forming a multilayer of reflective metal and a thin film (for example of approximately 5 nm thick) of alkali metal or alkali-earth metal.

According to the structure shown in this embodiment mode, the fourth layer 105 is provided between the second electrode 106 and the third layer 104, and the second electrode 106 including reflective metal and the third layer 104 including the transparent conductive film are not in direct contact. Therefore, electric erosion due to the difference in the self-potential can be prevented. That is to say, the reaction of the metal and the transparent conductive film can be prevented.

Not only the third layer 104 including the transparent conductive film but also the fourth layer 105 can have any thickness. Therefore, the degree of freedom to optimize the optical length L to the reflective metal from the first layer 102 containing a light-emitting material increases further. For this reason, the optical length can be optimized more easily so as to increase the external quantum efficiency or to increase the color purity of the emission light.

Since the first layer 102, the second layer 103, the third layer 104, the fourth layer 105, and the second electrode 106 are stacked, holes and electrons can be generated from the third layer. Since the second layer 103 contains a material having a donor level for generating electrons, the electrons generated from the third layer 104 has the small barrier for electrons to move from the third layer 104 to the second layer 103. Therefore, the electrons are easily moved to the second layer 103 and recombined with the holes injected from the first electrode in the first layer 102, thereby emitting light. On the other hand, the holes generated from the third layer 104 including the transparent conductive film has the small barrier for holes to move from the third layer 104 to the fourth layer 105 containing the hole-transporting medium; therefore, the holes are easily moved to the fourth layer and transported to the second electrode 106.

That is to say, in the structure according to the invention, the substantial moving distance of the electrons can be shortened, which enables the drive voltage to decrease. Therefore, when the optical length is optimized to increase the external quantum efficiency or the color purity and the distance to the reflective metal from the layer containing the light-emitting material is set to a certain distance, the substantial moving distance of the electrons can be shortened by employing the present invention, which enables the drive voltage to decrease.

In addition, even in the case of extending the distance to the metal from the layer containing the light-emitting material and increasing the film thickness in order to optimize the optical length, the increase in the drive voltage can be suppressed.

The contact resistance between the second layer 103 and the fourth layer 105 can be reduced by stacking the second layer 103 and the fourth layer 105 with the third layer 104 sandwiched therebetween. This makes it possible to further decrease the drive voltage. Since the third layer 104 is sandwiched therebetween, each of the materials for the second layer 103 and the fourth layer 105 can be selected from a wider range.

The contact resistance between the second layer 103 and the third layer 104 and the contact resistance between the third layer 104 and the fourth layer 105 are preferably low.

Embodiment 1

Figure 3:
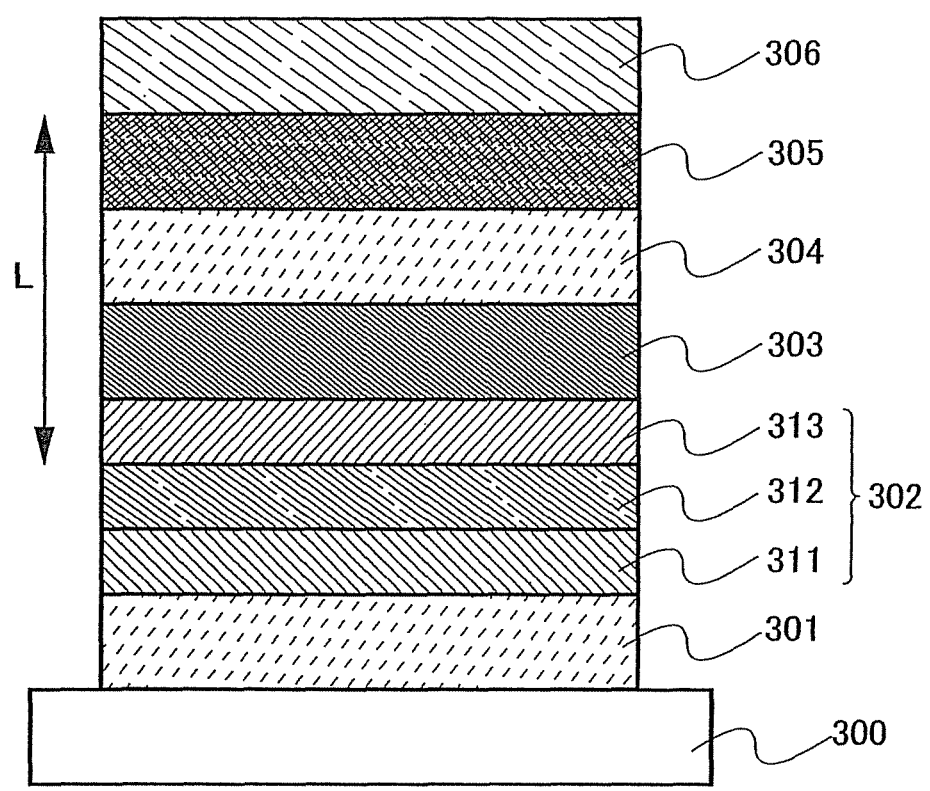
FIG. 3 is a diagram explaining an element structure of a light-emitting element according to a certain aspect of the present invention.

This embodiment explains a structure of a light-emitting element according to the present invention with reference to FIG. 3.

First, a first electrode 301 of a light-emitting element is formed over a substrate 300. Specifically, the first electrode 301 is formed with ITO, a transparent Conductive film, in 110 nm thick by a sputtering method. The first electrode 301 has a length of 2 mm on a side.

Next, a first layer 302 containing a light-emitting material is formed over the first electrode 301. The first layer 302 containing a light-emitting material in this embodiment has a multilayer structure including three layers 311, 312, and 313.

The substrate with the first electrode 301 formed thereover is fixed onto a substrate holder in a vacuum evaporation apparatus in such a way that the surface of the substrate with the first electrode 301 formed faces downward, and copper phthalocyanine (hereinafter referred to as Cu-Pc) is introduced into an evaporation source equipped inside the vacuum evaporation apparatus. Then, a hole-injecting layer 311 containing a hole-injecting material is formed in 20 nm thick by an evaporation method using a resistance heating method. A known hole-injecting material can be used as the material for the hole-injecting layer 311.

Next, a hole-transporting layer 312 is formed with a material superior in hole transportability. A known hole-transporting material can be used as the material for the hole-transporting layer 312. In this embodiment, α-NPD is formed in 40 nm thick by the same method.

Then, a light-emitting layer 313 is formed. A known light-emitting material can be used as the material for the light-emitting layer 313. In this embodiment, $Alq_3$ is formed in 40 nm thick by the same method.

In this manner, the three layers 311, 312, and 313 are stacked. Next, a second layer 303 is formed. In this embodiment, the second layer 303 is formed in 30 nm thick by a co-evaporation method by resistance heating in such a way that $Alq_3$ is used as an electron-transporting material (host material) and Mg is used as an electron-supplying material (guest material) to $Alq_3$. The proportion of the guest material is set 1 mass %.

Subsequently, a third layer 304 is formed. In this embodiment, ITO is used to form a transparent conductive layer in 140 nm thick.

Next, a fourth layer 305 is formed. In this embodiment, the fourth layer 305 is formed in 150 nm thick by a co-evaporation method by resistance heating in such a way that α-NPD is used as a hole-transporting material (host material) and molybdenum oxide is used as an electron-receiving material (guest material) to α-NPD. The proportion of the guest material is set 25 mass %.

Then, a second electrode 306 is formed by a sputtering method or an evaporation method. In this embodiment, the second electrode 306 is obtained by forming aluminum in 150 nm thick over the fourth layer 305 by an evaporation method.

Through the above steps, a light-emitting element of the invention is formed. In the structure shown in this embodiment, light can be emitted by applying higher potential to the first electrode 101 than that of the second electrode 106 and light generated by the recombination of the carriers in the first layer containing a light-emitting material is emitted from the first electrode 301 to the outside.

In the structure shown in this embodiment, the fourth layer is provided between ITO serving as the third layer and aluminum serving as the second electrode; therefore, the ITO and the aluminum are not in direct contact. This can prevent the electric erosion due to the difference in the self-potential between ITO and aluminum.

In addition, since the thicknesses of the third layer and the fourth layer can be set freely, the optical length from the first layer to the second electrode formed with the reflective metal can be optimized more easily.

Moreover, since the carriers can be generated from the third layer, the moving distance of the electrons is shorter than that in the element having a conventional structure. Therefore, the drive voltage can be decreased.

Embodiment 2

Figure 4:
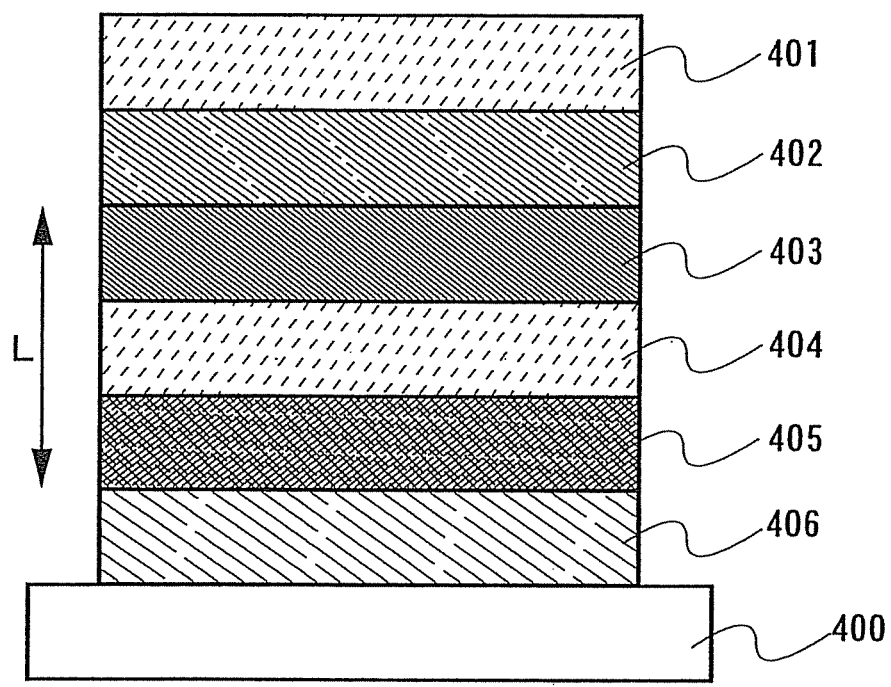
FIG. 4 is a diagram explaining an element structure of a light-emitting element according to a certain aspect of the present invention.

This embodiment explains a structure of a light-emitting element according to the present invention with reference to FIG. 4.

Since a substrate 400, a first electrode 401, a first layer 402, a second layer 403, a third layer 404, a fourth layer 405, and a second electrode 406 can be formed with the same material and in the same way as those in Embodiment Mode 1, the explanation is omitted. Even in this structure, light is emitted by applying higher potential to the first electrode 401 than that of the second electrode 406.

In addition, FIG. 4 has a structure including the second electrode 406 formed over the substrate 400, the fourth layer 405 formed over the second electrode 406, the third layer 404 formed over the fourth layer 405, the second layer 403 formed over the third layer 404, the first layer 402 containing a light-emitting material formed over the second layer 403, and the first electrode 401 formed over the first layer 402.

In the structure shown in this embodiment, light generated by the recombination of the carriers in the first layer containing a light-emitting material is emitted from the first electrode 401 to the outside.

Even in this structure shown in this embodiment, the same advantage as that obtained by the structure shown in Embodiment 1 can be obtained. Specifically, since the fourth layer is provided between the third layer and the second electrode, the electric erosion due to the difference in the self-potential can be prevented. In addition, since the film thicknesses of the third layer and the fourth layer can be set freely, the optical length from the first layer to the second electrode formed with reflective metal can be optimized more easily. Moreover, the moving distance of the electrons is shorter than that in the element having a conventional structure because the carrier can be generated from the third layer; therefore, the drive voltage can be decreased.

Embodiment 3

This embodiment explains a light-emitting device having a light-emitting element according to the present invention in its pixel portion with reference to FIGS. 5A and 5B. FIG. 5A is a top view showing the light-emitting device, and FIG. 5B is a cross-sectional view taken along A-A' in FIG. 5A. Reference numeral 501 shown with a dotted line denotes a driver circuit portion (source driver circuit); 502, a pixel portion; 503, a driver circuit portion (gate driver circuit); 504, a seal substrate; 505, a sealant; and 507, a space surrounded by the sealant 505.

A lead wiring 508 denotes a wiring for transmitting signals to be inputted into the source driver circuit 501 and the gate driver circuit 503, which receives signals such as a video signal, a clock signal, a start signal, and a reset signal from an FPC (flexible-printed circuit) 509 serving as an external input terminal. Although only the FPC is shown here, a print wiring board (PWB) may be attached to this FPC and the light-emitting device in this specification may include not only the light-emitting device itself but also the light-emitting device with the FPC or the PWB attached thereto.

Next, the cross-sectional structure is explained with reference to FIG. 5B. The driver circuit portion and the pixel portion are formed over a substrate 510. In this embodiment, the source driver circuit 501, which is the driver circuit portion, and the pixel portion 502 are shown.

In the source driver circuit 501, a CMOS circuit in which an n-channel TFT and a p-channel TFT 524 are combined is formed. In addition, a for forming the driver circuit may be formed with a known CMOS circuit, PMOS circuit, or NMOS circuit. Although this embodiment shows a driver integrated type in which a driver circuit is formed over the same substrate, but not exclusively, the driver circuit can be formed outside the substrate.

The pixel portion 502 is formed with a plurality of pixels including a switching TFT 511, a current control TFT 512, and a first electrode 513 connected electrically with the drain of the current control TFT. An insulator 514 is formed so as to cover the end portion of the first electrode 513. Here, a positive photosensitive acrylic resin film is used as the insulator 514.

In order to improve the coverage, the insulator 514 is formed so as to have curvature at its upper end or lower end. For example, in the case of using positive photosensitive acrylic for the insulator 514, only the upper end portion of the insulator 514 preferably has a radius of curvature of 0.2 μm to 3 μm. The insulator 514 may be formed with either a negative type, which becomes insoluble to the etchant by the irradiation of light, or a positive type, which becomes soluble to the etchant by the irradiation of light. Not only the organic compound but also an inorganic compound such as silicon oxide or silicon oxynitride can be used. In addition, a material composed of a skeleton structure formed by the bond of silicon and oxygen having as a substituent an organic group at least containing hydrogen (such as an alkyl group or aryl group), a fluoro group, or an organic group at least containing hydrogen and a fluoro group, a so-called siloxane can also be used.

An electroluminescence layer 516 including first to fourth layers, and a second electrode 517 are each formed over the first electrode 513. The first electrode (anode) 513 is preferably formed with a light-transmitting material such as indium tin oxide. (ITO), indium tin oxide containing silicon oxide (ITSO), zinc oxide (ZnO), indium oxide containing zinc oxide by 2% to 20% (IZO), zinc oxide containing gallium (GZO), tin oxide ($SnO_2$), or indium oxide ($In_2O_3$).

The first to fourth layers of the electroluminescence layer 516 are each formed by resistance heating, an evaporation method by an electron beam both using an evaporation mask, or an ink-jet method. The first to fourth layers of the electroluminescence layer 516 include a first layer containing a light-emitting material, a second layer, a third layer including a transparent conductive film, and a fourth layer, in which the first layer, the second layer, the third layer, and the fourth layer are stacked sequentially from the first electrode toward the second electrode, and the fourth layer is formed so as to be in contact with the second electrode. As the material for the layer containing the light-emitting material, an organic compound is generally used in a single-layer, multilayer, or a mixed-layer structure. However, in the invention, an inorganic compound may also be used as a part of a film containing the organic compound. In this case, deposition by a sputtering method may be employed.

A layer containing a plurality of materials can be formed by depositing each material simultaneously. The layer containing a plurality of materials is desirably formed by combining the same kinds of methods or the different kinds of methods such as a co-evaporation method with resistance heating evaporation methods, a co-evaporation method with electron beam evaporation methods, a co-evaporation method with a resistance heating evaporation method and an electron beam evaporation method, deposition with a resistance heating evaporation method and a sputtering method, or deposition with an electron beam evaporation method and a sputtering method. In addition, although a layer containing two kinds of materials are assumed in the above examples, the layer containing a plurality of materials can be similarly formed in the case of containing three or more kinds of materials.

Metal having high reflectivity is preferable as the material for the second electrode 517 (cathode) formed over the electroluminescence layer 516. For example, aluminum (Al), silver (Ag), or alloy containing Al or Ag such as an AlLi alloy or an MgAg alloy can be used.

Further, a light-emitting element 518 is provided within the space 507 surrounded with the element formed substrate 510, the sealing substrate 504, and the sealant 505 by attaching the sealing substrate 504 to the element formed substrate 510 with the sealant 505. The space 507 is filled with a filling material, for example, inert gas such as nitrogen or argon, or the sealant 505.

An epoxy-based resin and the like are preferably used for the sealant 505. It is desirable that these materials do not transmit oxygen or moisture as much as possible. As the material for the sealing substrate 504, a plastic substrate made of FRP (Fiberglass-Reinforced Plastics), PVF (polyvinyl fluoride), Mylar, polyester, acrylic, or the like as well as a glass substrate or a quartz substrate can be used.

As thus described, a light-emitting device having a light-emitting element according to the invention can be obtained.

This embodiment can be arbitrarily combined with other embodiment mode and embodiments.

Embodiment 4

This embodiment explains a structure of the above layer containing a light-emitting material in detail.

The layer containing a light-emitting material is formed from charge-injecting-transporting material and a light-emitting material containing an organic compound or an inorganic compound. The layer containing a light-emitting material includes one or a plurality of layers of a low molecular weight organic compound, a middle molecular weight organic compound, and a high molecular weight organic compound. Alternatively, an inorganic compound having electron-injecting transportability or hole-injecting transportability may also be combined.

The following metal complex or the like having a quinoline skeleton or a benzoquinoline skeleton can be given particularly as an example of the material having high electron transportability among the charge-injecting-transporting material: tris(8-quinolinolato)aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), bis(2-methyl-8-quinolinolato)-4-phenylphenolato-aluminum (abbreviated to BAlq) or the like. In addition, the following material having an aromatic-amine skeleton (that is, a material having a benzene ring-nitrogen bond) can be given as an example of the material having high hole transportability: 4,4'-bis[N-(1-naphthyl)-N-phenyl-amino]-biphenyl (abbreviated to α-NPD), 4,4'-bis[N-(3-methylphenyl)-N-phenyl-amino]biphenyl (abbreviated to TPD), 4,4',4''-tris(N,N-diphenyl-amino)-triphenylamine (abbreviated to TDATA), 4,4',4''-tris[N-(3-methylphenyl)-N-phenyl-amino]riphenylamine (abbreviated to MTDATA), or the like.

Moreover, a compound of alkaline metal or alkaline earth metal such as lithium fluoride (LiF), cesium fluoride (CsF), or calcium fluoride ($CaF_2$) can be given particularly as an example of the material having high electron injectability among the charge-injecting-transporting material. Additionally, a mixture of a substance having high electron transportability such as $Alq_3$ and an alkaline earth metal such as magnesium (Mg) may also be applied.

The following metal oxide can be given as an example of the material having high hole injectability among the charge-injecting-transporting material: molybdenum oxide ($MoO_x$), vanadium oxide ($VO_x$), ruthenium oxide ($RuO_x$), tungsten oxide ($WO_x$), manganese oxide ($MnO_x$), or the like. Additionally, a phthalocyanine-based compound such as phthalocyanine (abbreviated to $H_2Pc$) or copper phthalocyanine (CuPc) can be given as an example.

A light-emitting layer may have a structure performing a color display by forming a light-emitting layer having different emission wavelength ranges in each pixel. Typically, a light-emitting layer corresponding to each color of R (red), G (green) and B (blue) is formed. In this case, color purity can also be improved and a mirror surface of a pixel portion can be prevented by having a structure provided with a filter (colored layer) in which light in the emission wavelength range is transmitted on the side where light from a pixel is emitted. It is possible to skip providing a circular polarizing plate or the like which is conventionally necessary by providing the filter (colored layer), and this can prevent loss of light emitted from the light-emitting layer. Further, there can be less variation of color tone generated in the case of obliquely seeing the pixel portion (a display screen).

There are various light-emitting materials which form the light-emitting layer. The following can be used as a low molecular weight organic light-emitting material: 4-dicyanomethylene-2-methyl-6-[2-(1,1,7,7-tetramethyljulolidine-9-yl)ethenyl]-4H-pyran (abbreviated to DCJT) 4-dicyanomethylene-2-t-butyl-6-[2-(1,1,7,7-tetramethyljulolidine-9-yl)ethenyl]-4H-pyran, periflanthen, 2,5-dicyano-1,4-bis[2-(10-methoxy-1,1,7,7-tetramethyljulolidine-9-yl)ethenyl]benzene, N,N'-dimethylquinacridon (abbreviated to DMQd), coumarin6, coumarin545T, tris(8-quinolinolato)aluminum (abbreviated to $Alq_3$), 9,9'-bianthryl, 9,10-diphenylanthracene (abbreviated as DPA), 9,10-bis(2-naphthyl)anthracene (abbreviated to DNA), or the like. Alternatively, another material may also be used.

On the other hand, a high molecular weight organic light-emitting material has higher physical strength and higher durability of an element compared with the low molecular weight organic light emitting material. In addition, since the film-forming by coating is possible, manufacturing the element is comparatively easy. The structure of a light-emitting element using the high molecular weight organic light-emitting material is basically the same as in the case of using the low molecular weight organic light-emitting material, in which a cathode, an organic light-emitting layer, and an anode are stacked. However, in forming a light-emitting layer using the high molecular weight organic light-emitting material, it is difficult to form a multilayer structure as in the case of using the low molecular weight organic light-emitting material; thus, a two-layer structure is formed in many cases. Specifically, a cathode, a light-emitting layer, a hole-transporting layer, and an anode are stacked in the multilayer structure.

Since luminescence color, depends on materials which form a light-emitting layer, a light-emitting element that shows a desired luminescence by selecting these materials can be formed. Polyparaphenylene vinylene based, polyparaphenylene based, polythiophene based and polyfluorene based light-emitting materials are given as an example of a high molecular weight electroluminescence material which can be used to form a light-emitting layer.

The following can be given as an example of the polyparaphenylene vinylene based light-emitting material: a derivative of poly(paraphenylenevinylene) [PPV], poly(2,5-dialkoxy-1,4-phenylenevinylene) [RO-PPV], poly(2-(2'-ethylhexoxy)-5-methoxy-1,4-phenylenevinylene) [MEH-PPV], poly(2-(dialkoxyphenyl)-1,4-phenylenevinylene) [ROPh-PPV], or the like. The following can be given as an example of the polyparaphenylene based light-emitting material: a derivative of polyparaphenylene [PPP], poly(2,5-dialkoxy-1,4-phenylene) [RO-PPP], poly(2,5-dihexoxy-1,4-phenylene), or the like. The following can be given as an example of the polythiophene based light-emitting material: a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2bithiophene] [PTOPT], or the like. The following can be given as an example of the polyfluorene based light-emitting material: a derivative of polyfluorene [PF], poly(9,9-dialkylfluorene) [PDAF], poly(9,9-dioctylfluorene) [PDOF], or the like.

Note that the hole injectability from an anode can be enhanced when a high molecular weight organic light-emitting material having hole transportability is sandwiched between an anode and a high molecular organic light-emitting material having light-emitting properties. Generally, a high molecular weight organic light-emitting material is coated with a solution in which an acceptor material is dissolved in water by a spin-coating method or the like. In addition, since the acceptor material is insoluble in an organic solvent, the organic light-emitting material having light-emitting properties mentioned above can be stacked therewith. A mixture of PEDOT and camphor sulfonic acid (CSA) as an acceptor material, a mixture of polyaniline [PANI] and polystyrenesulphonic [PSS] as an acceptor material or the like can be given as an example of the high molecular weight organic light-emitting material having hole transportability.

In addition, a light-emitting layer can have a structure emitting monochromatic or white light emission. The case of using a white light-emitting material enables a color display by constituting a structure provided with a filter (a colored layer) transmitting light having a particular wavelength on the side where light from a pixel is emitted.

In order to form a light-emitting layer having white light emission, for example, $Alq_3$, $Alq_3$ partially doped with Nile Red, which is a red light emitting pigment, $Alq_3$, p-EtTAZ, and TPD (aromatic diamine) are stacked sequentially by an evaporation method, thereby being able to obtain white light emission. In addition, in the case of forming an EL by a coating method using spin coating, the EL layer is preferably baked by vacuum heating after the coating. For example, an entire surface may be coated with a poly (ethylenedioxythiophene)/poly (styrenesulfonic acid) solution (PEDOT/PSS) and baked in order to form a film that serves as a hole-injecting layer. Thereafter, the entire surface may be coated with a polyvinyl carbazole (PVK) solution doped with luminescent center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) and baked in order to form a film that serves as a light emitting layer.

A light-emitting layer can be formed in a single layer, and a 1,3,4-oxadiazole derivative (PBD) having electron transportability may be dispersed in polyvinyl carbazole (PVK) having hole transportability. In addition, white light emission can be obtained by dispersing PBD by 30 wt % as an electron-transporting agent and dispersing appropriated doses of four kinds of dyes (TPB, coumarin6, DCM1 and Nile Red). In addition to the light-emitting element with which white light emission is obtained, as shown here, a light-emitting element that can obtain red light emission, green light emission, or blue light emission can be manufactured by selecting the materials of the light-emitting layer appropriately.

Further, a triplet excited light-emitting material including a metal complex or the like may be used for the light-emitting layer in addition to a singlet excited light-emitting material. For example, among a pixel having red light-emitting properties, a pixel having green light-emitting properties and a pixel having blue light-emitting properties, the pixel having red light-emitting properties with comparatively short half reduced luminescence time is formed from a triplet excited light-emitting material, and other pixels are formed from a singlet excited light-emitting material. Since the triplet excited light-emitting material has preferable luminous efficiency, there is a feature that less power consumption is required to obtain the same luminance. In other words, in the case of applying the triplet excited light-emitting material to the red pixel, a few amount of current flown to a light-emitting element is required; therefore, the reliability can be enhanced. The pixel having red light-emitting properties and the pixel having green light-emitting properties may be formed from a triplet excited light-emitting material, and the pixel having blue light-emitting properties may be formed from a singlet excited light-emitting material to reduce the power consumption. Further low power consumption can be realized by also forming the green light-emitting element, which has high human spectral luminous efficacy, from a triplet excited light-emitting material.

A metal complex used as a dopant, a metal complex in which platinum, which is a third transition series element, serves as a center metal, a metal complex in which iridium serves as a center metal, or the like is known as an example of a triplet excited light-emitting material. The triplet excited light-emitting material is not limited to these compounds and it is also possible to use a compound having the above structure and having an element belonging to Groups 8 to 10 of a periodic table for a center metal.

The substances mentioned above that forms the light-emitting layer are just an example, and a light-emitting element can be formed by stacking appropriately each functional layer such as a hole-injecting-transporting layer, a hole-transporting layer, an electron-injecting-transporting layer, an electron-transporting layer, a light-emitting layer, an electron-blocking layer, or a hole-blocking layer. Moreover, a mixed layer or mixed junction in which each of these layers is mixed may be formed. The layer structure of the light-emitting layer is changeable. Such modification as providing an electrode for the electron injection and providing a light-emitting material by being dispersed instead of the particular electron-injecting region and the light-emitting region is allowable within the scope of the invention.

The light-emitting element formed by using the material mentioned above emits light by being biased in a forward direction. A pixel of a display device formed by using the light-emitting element can be driven by a simple matrix mode or an active matrix mode. In any event, each pixel is emitted by applying a forward bias thereto in specific timing; however, the pixel is in a non-luminescent state for a certain period. Reliability of a light-emitting element can be enhanced by applying bias in the opposite direction (a reverse bias) during this non-luminescent period. In a light-emitting element, there is a deterioration mode in which emission intensity is decreased under a certain driving condition or a deterioration mode in which luminance is apparently decreased due to the expansion of a non-luminescent region in the pixel. However, the progression of deterioration can be delayed by alternating current driving. Accordingly, reliability of a light emitting device can be enhanced.

This embodiment can be arbitrarily combined with other embodiment mode and embodiments.

Embodiment 5

This embodiment explains a module installed with such a light-emitting device shown in Embodiment 3.

Figure 7A:
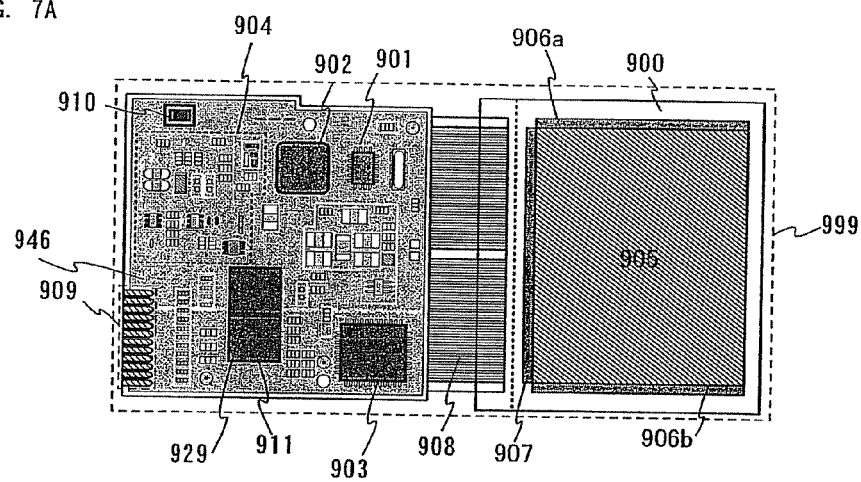
FIGS. 7A and 7B are views each explaining a module mounted a light-emitting device.

In a module 999 of an information terminal shown in FIG. 7A, a controller 901, a central processing unit (CPU) 902, a memory 911, a power supply circuit 903, an audio processing circuit 929, and a transmitter/receiver circuit 904 as well as other elements such as a resistor, a buffer, and a capacitor element are mounted on a printed-wiring board 946. In addition, a display panel 900 including a light-emitting device is connected to the printed-wiring board 946 through a flexible-printed circuit (FPC) 908.

The display panel 900 includes a pixel portion 905 where a light-emitting element is disposed in each pixel, a first scanning line driver circuit 906*a* and a second scanning driver circuit 906*b* each for selecting a pixel included in the pixel portion 905, and a signal line driver circuit 907 for supplying a video signal to the selected pixel.

Various control signals are inputted and outputted through an interface (I/F) portion 909 provided for the printed-wiring board 946. In addition, the printed-wiring board 946 is provided with an antenna port 910 for transmitting/receiving signals to/from the antenna.

Although the printed-wiring board 946 is connected to the display panel 900 through the FPC 908 in this embodiment, the invention is not necessarily limited to this structure. The controller 901, the audio processing circuit 929, the memory 911, the CPU 902, or the power supply circuit 903 may be mounted directly on the display panel 900 by using a COG (Chip on Glass) method. In addition, the printed-wiring board 946 is provided with various elements such as a capacitor element or a buffer, which prevents noise from causing in the power supply voltage or signals, or the rise of the signal from becoming slow.

Figure 7B:
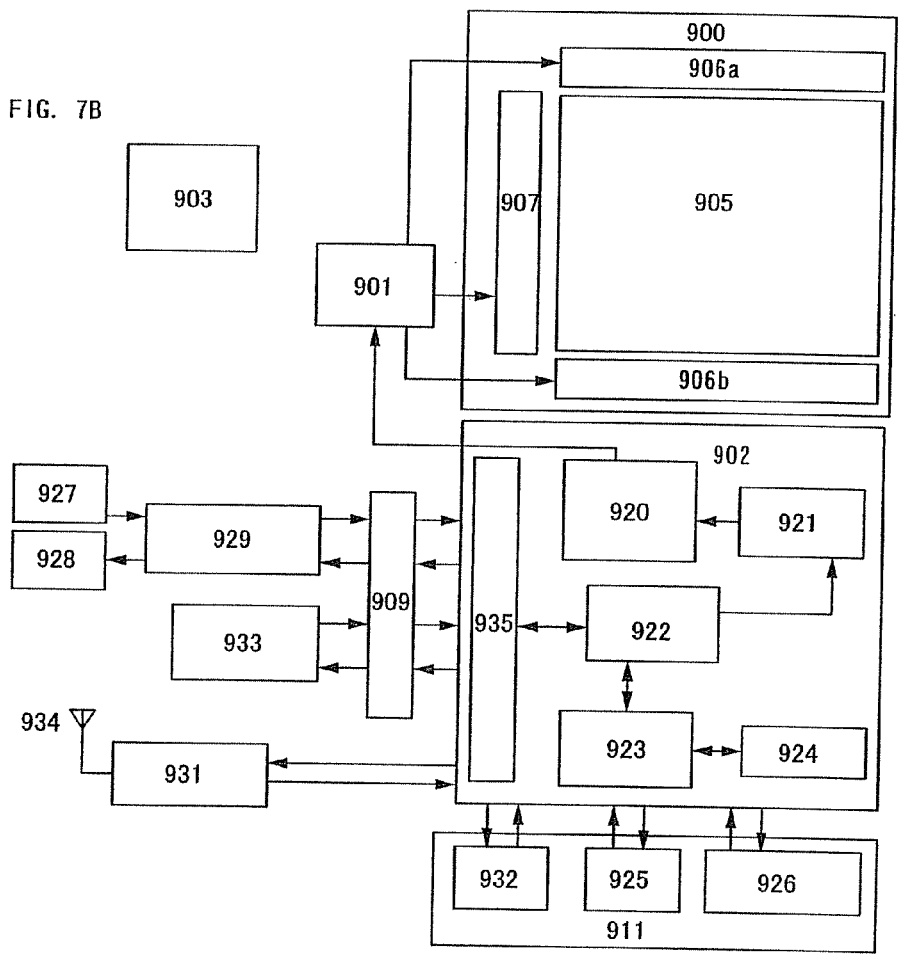

FIG. 7B shows a block diagram of the module 999 shown in FIG. 7A. This module 999 includes a VRAM 932, a DRAM 925, a flash memory 926, and the like as the memory 911. Data of an image to be displayed in the panel are stored in the VRAM 932, image data or audio data are stored in the DRAM 925, and various programs are stored in the flash memory 926.

In the power supply circuit 903, power supply voltage for the display panel 900, the controller 901, the CPU 902, the audio processing circuit 929, the memory 911, and the transmitter/receiver circuit 931 is generated. In some cases, the power supply circuit 903 is provided with a current source depending on the panel specification.

The CPU 902 includes a control signal generating circuit 920, a decoder 921, a register 922, an operation circuit 923, a RAM 924, an interface 935 for CPU, and the like. The various signals inputted into the CPU 902 through the interface 935 are once stored in the register 922, and then, are inputted into the operation circuit 923, the decoder 921, and the like. In the operation circuit 923, an operation is performed based on the inputted signal, and a place to which various instructions are transmitted is designated. On the other hand, the signal inputted into the decoder 921 is decoded and is inputted into the control signal generating circuit 920. A signal including various instructions is generated in the control signal generating circuit 920 base on the inputted signal and is transmitted to the place designated by the operation circuit 923, specifically, to the memory 911, the transmitter/receiver circuit 931, the audio processing circuit 929, the controller, or the like.

The memory 911, the transmitter/receiver circuit 931, the audio processing circuit 929, and the controller 901 each operate according to each of the received instructions. Each operation is briefly explained hereinafter.

A signal inputted from an input means 933 is transmitted to the CPU 902 which is mounted on the printed-wiring board 946 through the interface 909. In the control signal generating circuit 920, the image data stored in the VRAM 932 is converted to a predetermined format in accordance with the signal transmitted from the input means 933 such as a pointing device or a keyboard and is sent to the controller 901.

A signal including the image data transmitted from the CPU 902 is data-processed in accordance with the panel specification in the controller 901 and is supplied to the display panel 900. In addition, a Hsync signal, a Vsync signal, a clock signal CLK, a volts alternating current (AC Cont), and a switching-over signal L/R are generated in the controller 901 in accordance with a power supply voltage inputted from the power supply circuit 903 or various signals inputted from the CPU 902 and are supplied to the display panel 900.

In the transmitter/receiver circuit 904, a signal that is transmitted and received as an electric wave in an antenna 934 is processed, and specifically, a high frequency circuit such as an isolator, a band pass filter, a VCO (Voltage Controlled Oscillator), an LPF (Low Pass Filter), a coupler, and a balun is included. A signal including audio information among the signals transmitted and received in the transmitter/receiver circuit 904 is transmitted to the audio processing circuit 929 by an instruction of the CPU 902.

A signal including audio information transmitted by the instruction of the CPU 902 is demodulated into an audio signal in the audio processing circuit 929 and is transmitted to a speaker 928. An audio signal transmitted from a microphone 927 is modulated in the audio processing circuit 929 and is transmitted to the transmitter/receiver circuit 904 by the instruction of the CPU 902.

The controller 901, the CPU 902, the power supply circuit 903, the audio processing circuit 929, and the memory 911 can be mounted as a package of this embodiment. This embodiment can be applied to anything but a high frequency circuit such as an isolator, a band pass filter, a VCO (Voltage Controlled Oscillator), an LPF (Low Pass Filter), a coupler, or a balun.

In the display panel 900, a transparent conductive film is not in direct contact with a reflective electrode with optimization of the optical length in its light-emitting element. Therefore, the electric erosion of the transparent conductive film and the reflective electrode can be prevented. Accordingly, in the module 999 equipped with this display panel 900, the deterioration due to the electric erosion can be decreased and display quality is improved as well. Therefore, it is possible to provide a module having preferable display quality, high reliability, and long life time.

This embodiment can be arbitrarily combined with other embodiment mode and embodiments.

Embodiment 6

Figure 8:
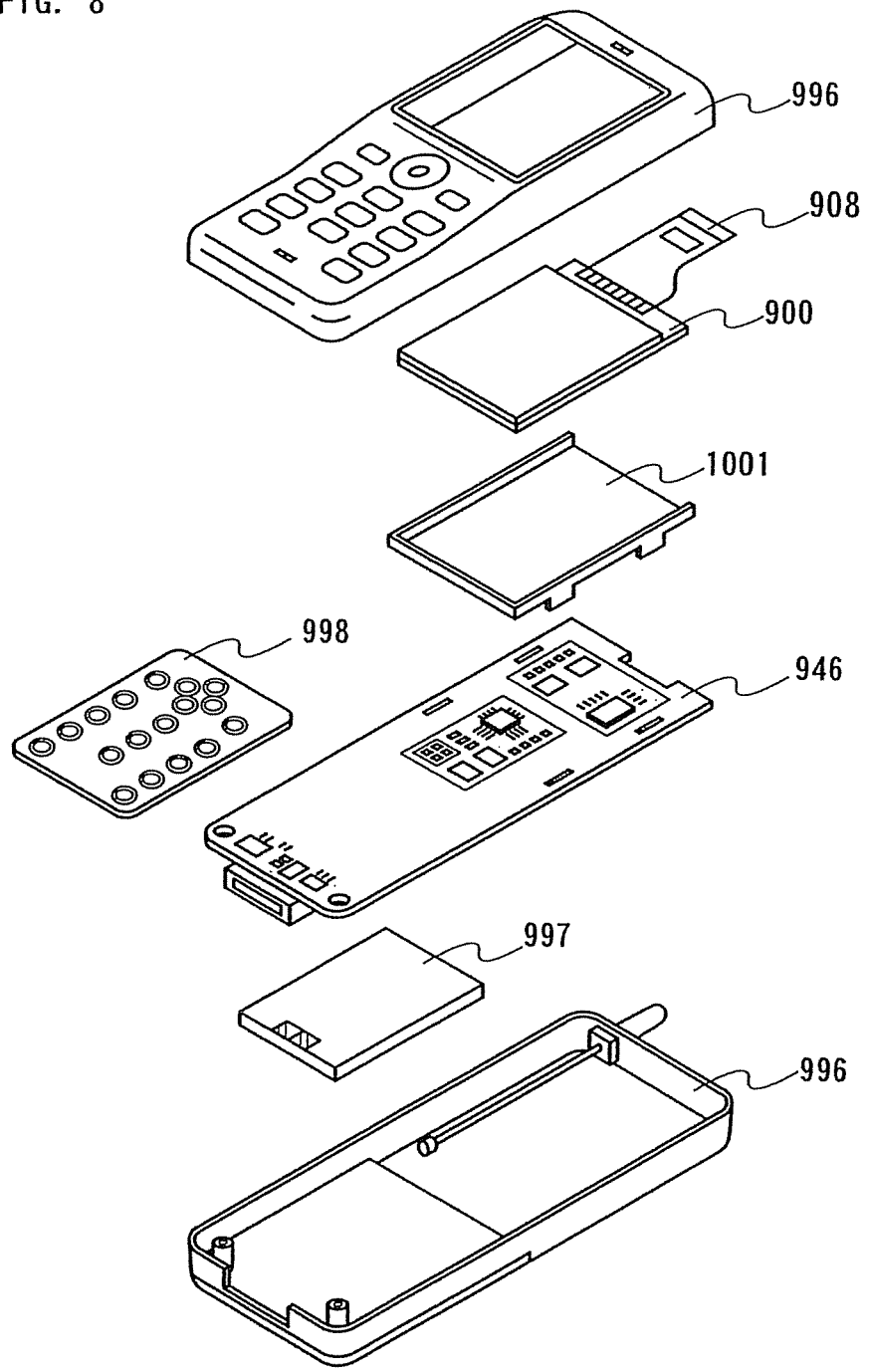
FIG. 8 is a view explaining an electronic device.

FIG. 8 shows one mode of an electronic device including the module 999 as shown in Embodiment 5. A display panel 900 is capable of being integrated with the module 999 easily by being incorporated into a housing 1001 in a free desorption manner. The shape or dimension of the housing 1001 can be changed arbitrarily according to the electronic device in which the housing 1001 is incorporated.

The housing 1001 that fixed the display panel 900 is inserted in a printed-wiring board 946 and is built up as a module. A controller, a CPU, a memory, and a power supply circuit as well as other elements such as a resistor, a buffer, and a capacitor element are mounted on the printed-wiring board 946. Further, an audio processing circuit, a transmitter/receiver circuit, or the like may be mounted depending on the purpose. The display panel 900 is connected to the printed-wiring board 946 through an FPC 908.

Such module 999, an input means 998, and a battery 997 are held in casings 996. A pixel portion of the display panel 900 is disposed so that it is visible from an opening window formed in the casing 996.

In the display panel 900, a transparent conductive film is not in direct contact with a reflective electrode with optimization of the optical length in its light-emitting element. Therefore, the electric erosion of the transparent conductive film and the reflective electrode can be prevented. Accordingly, in the module 999 equipped with this display panel 900, the deterioration due to the electric erosion can be decreased and display quality is improved as well. Therefore, it is possible to provide a cellular phone having preferable display quality, high reliability, and long life time.

Embodiment 7

This embodiment explains a mode of an electronic device on which the module as shown in Embodiment 5 is mounted, which is different from that shown in Embodiment 6.

Electronic devices manufactured using light-emitting devices having light-emitting elements according to the present invention include a camera such as a video camera or a digital camera, a goggle type display (head mounted display), a navigation system, an audio reproducing device (such as a car audio or an audio component), a personal computer, a game machine, a portable information terminal (a mobile computer, a cellular phone, a portable game machine, an electronic book, or the like), an image reproducing device provided with a recording medium (specifically a device capable of playing a recording medium such as a Digital Versatile Disc (DVD) and that has a display device capable of displaying the image), or the like. These electronic devices are specifically shown in FIGS. 6A to 6E.

Figure 6A:
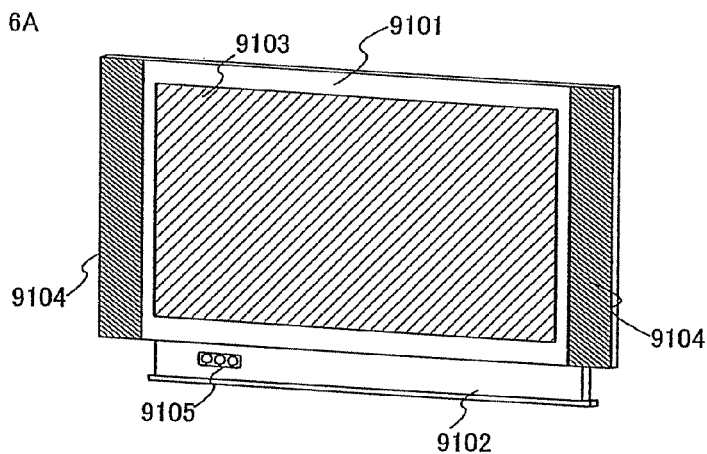
FIGS. 6A to 6E are views each explaining an electronic device.

FIG. 6A is a television receiver, which includes a casing 9101, a supporting stand 9102, a display portion 9103, speaker portions 9104, a video input terminal 9105, and the like. The television receiver is manufactured by using the light-emitting device having a light-emitting element of the present invention for its display portion 9103. A reflective metal and a transparent conductive film are not in direct contact with optimization of the optical length in the light-emitting element of the display portion 9103. Therefore, the electric erosion due to the difference in the self-potentials can be prevented; thus, the reliability of the television receiver is improved. Note that the television receiver includes all the information display devices for a computer, TV broadcast reception, advertisement display, and the like.

Figure 6B:
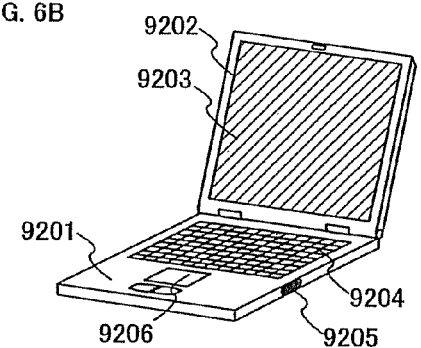

FIG. 6B is a personal computer, which includes a main body 9201, a casing 9202, a display portion 9203, a keyboard 9204, an external connection port 9205, a pointing mouse 9206, and the like. The personal computer is manufactured by using the light-emitting device having a light-emitting element of the invention for its display portion 9203. A reflective metal and a transparent conductive film are not in direct contact with optimization of the optical length in the light-emitting element of the display portion 9203. Therefore, the electric erosion due to the difference in the self-potentials can be prevented; thus, the reliability of the personal computer is improved.

Figure 6C:
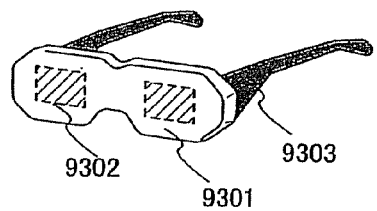

FIG. 6C is a goggle-type display, which includes a main body 9301, display portions 9302, arm portions 9303, and the like. The goggle-type display is manufactured by using the light-emitting device having a light-emitting element of the invention for its display portion 9302. A reflective metal and a transparent conductive film are not in direct contact with optimization of the optical length in the light-emitting element of the display portion 9302 Therefore, the electric erosion due to the difference in the self-potentials can be prevented; thus, the reliability of the goggle-type display is improved.

Figure 6D:
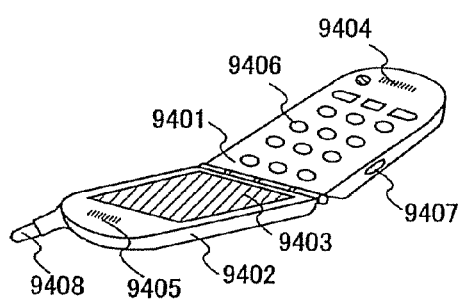

FIG. 6D is a cellular phone, which includes a main body 9401, a casing 9402, a display portion 9403, an audio input portion 9404, an audio output portion 9405, operation keys 9406, an external connection port 9407, an antenna 9408, and the like. The cellular phone is manufactured by using the light-emitting device having a light-emitting element of the invention for its display portion 9403. A reflective metal and a transparent conductive film are not in direct contact with optimization of the optical-length in the light-emitting element of the display portion 9403. Therefore, the electric erosion due to the difference in the self-potentials can be prevented; thus, the reliability of the cellular phone is improved. Note that the power consumption of the cellular phone can be suppressed by displaying white letters on a black background of the display portion 9403.

Figure 6E:
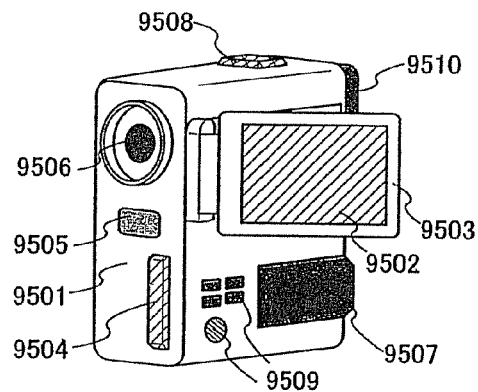

FIG. 6E is a video camera, which includes a main body 9501, a display portion 9502, a casing 9503, an external connection port 9504, a remote control receiving portion 9505, an image receiving portion 9506, a battery 9507, an audio input portion 9508, operation keys 9509, an eyepiece portion 9510, and the like. The video camera is manufactured by using the light-emitting device having a light-emitting element of the invention for its display portion 9502. A reflective metal and a transparent conductive film are not in direct contact with optimization of the optical length in the light-emitting element of the display portion 9502. Therefore, the electric erosion due to the difference in the self-potentials can be prevented; thus, the reliability of the video camera is improved.

As mentioned above, the light-emitting device having a light-emitting element according to the invention can be applied in an extremely wide range, and this light-emitting device can be applied to electronic devices of every field. By using the light-emitting element of the invention, the optical length to the reflective metal from the layer containing a light-emitting material can be optimized without increasing the drive voltage.

This embodiment can be arbitrarily combined with other embodiment mode and embodiments.

Embodiment 8

Figure 9:
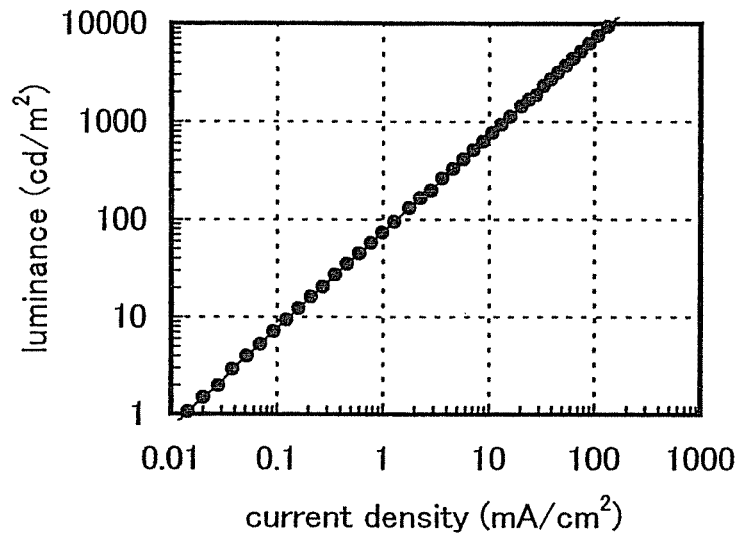
FIG. 9 is a graph of a current density-luminance characteristic of a light-emitting element according to a certain aspect of the present invention.
Figure 10:
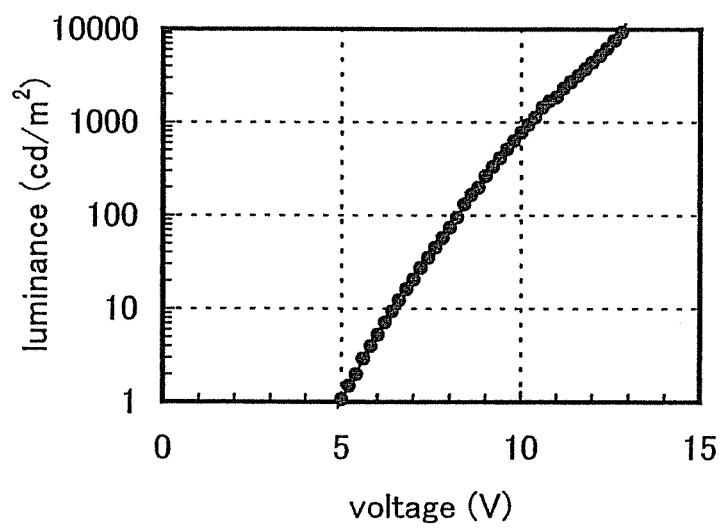
FIG. 10 is a graph of a voltage-luminance characteristic of a light-emitting element according to a certain aspect of the present invention.
Figure 11:
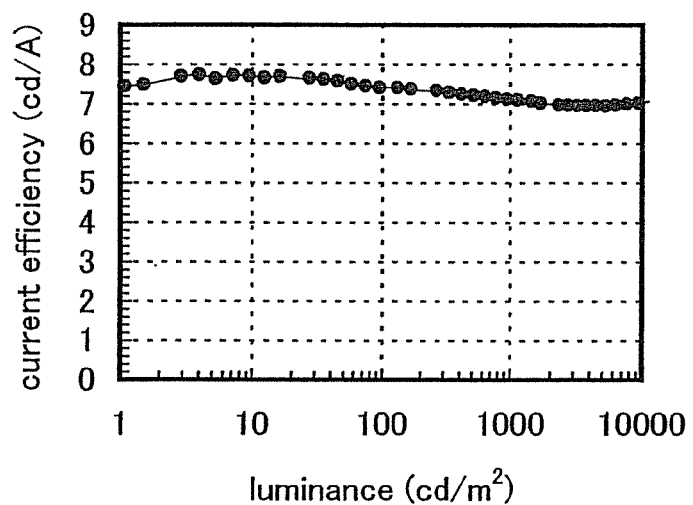
FIG. 11 is a graph of a luminance-current efficiency characteristic of a light-emitting element according to a certain aspect of the present invention.
Figure 12:
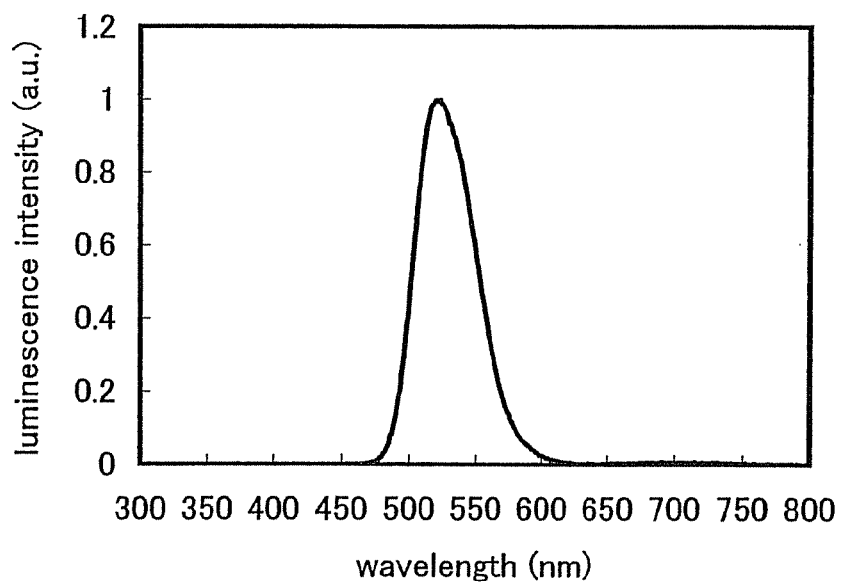
FIG. 12 is a graph of a light-emitting spectrum of a light-emitting element according to a certain aspect of the present invention.

FIGS. 9 to 12 each show characteristics of a light-emitting element of the present invention in a graph. FIG. 9 shows a current density-luminance characteristic, FIG. 10 shows a voltage-luminance characteristic, FIG. 11 shows a luminance-current efficiency characteristic, and FIG. 12 shows an emission spectrum.

A light-emitting element is formed over a glass substrate and ITO is formed sequentially from the glass substrate side in 110 nm thick as a first electrode 101. ITO is formed by a sputtering method and etched to have its shape as large as 2 mm×2 mm. Next, the surface of the substrate is cleaned with porous resin (typically, made from PVA (polyvinyl alcohol), nylon, or the like), heat treatment is performed at 200° C. for one hour, and UV ozone treatment is performed for 370 seconds as pretreatment for forming the light-emitting element over the first electrode 101.

Then, CuPc is formed as a hole-injecting layer to be 20 nm thick. Subsequently, NPB is formed as a hole-transporting layer to be 40 nm thick. Alq$_3$ and coumarin 6 are formed over these lamination films as a light-emitting layer to be 1:0.01 in mass ratio. The light-emitting layer is formed to be 40 nm thick. In this embodiment, three layers of the hole-injecting layer, the hole-transporting layer, and the light-emitting layer correspond to the first layer 102. Further, Alq$_a$ and lithium are formed as a second layer 103 to be 1:0.01 in mass ratio. The second layer is formed to be 30 nm thick. Thereafter, molybdenum oxide is formed as a third layer 104 to be 110 nm thick and NPB and molybdenum oxide are formed as a fourth layer 105 to be 1:0.25 in mass ratio. Note that the fourth layer 105 is formed to be 140 nm thick. Subsequently, Al is formed as a second electrode 106 in 200 nm thick to complete elements and lastly sealing is performed under a nitrogen atmosphere so as not to expose the elements to an atmosphere. Note that any one of the film formations of the hole-injecting layer to the second electrode is performed by a vacuum vapor deposition method by resistance heating.

FIGS. 9 to 11 show that the light-emitting element of the invention functions favorably as a light-emitting element. In addition, FIG. 12 shows that the light-emitting element of this embodiment emits favorable green light.

The invention claimed is:

1. A light-emitting device comprising:
    an anode;
    a first layer over the anode, the first layer comprising a light-emitting material;
    a second layer over and in direct contact with the first layer;
    a third layer over and in direct contact with the second layer, the third layer comprising a transparent conductive film;
    a fourth layer over the third layer, the fourth layer comprising an organic compound doped with an electron-receiving material to the organic compound; and
    a cathode over and in direct contact with the fourth layer, the cathode comprising a metal,
    wherein each of the second layer and the third layer has a single layer structure,
    wherein the second layer comprises a material selected from zinc oxide, tin oxide, titanium oxide, zinc sulfide, zinc selenide, and zinc telluride, and
    wherein the transparent conductive film comprises a material selected from the group consisting of tin oxide, indium oxide, zinc oxide, zinc oxide containing gallium, and molybdenum oxide.

2. The light-emitting device according to claim 1, wherein the organic compound is a hole-transporting material.

3. The light-emitting device according to claim 2, wherein the hole-transporting material is a material having an aromatic-amine skeleton.

4. The light-emitting device according to claim 1, wherein the electron-receiving material is a metal oxide.

5. The light-emitting device according to claim 4, wherein the metal oxide is selected from molybdenum oxide, vanadium oxide, and rhenium oxide.

6. The light-emitting device according to claim 1, wherein the first layer has a multilayer structure.

7. The light-emitting device according to claim 1, further comprising a fifth layer between the anode and the first layer.

8. The light-emitting device according to claim 7, wherein the fifth layer comprises a hole-transporting material.

9. The light-emitting device according to claim 1, further comprising a filter on the side where light is extracted.

10. An electronic device of which display portion is equipped with the light-emitting device according to claim 1.

11. A light-emitting device comprising:
    an anode;
    a first layer over the anode, the first layer comprising a light-emitting material;
    a second layer over and in direct contact with the first layer and comprising a first organic compound doped with an electron-supplying material to the first organic compound;
    a third layer over and in direct contact with the second layer, the third layer comprising a transparent conductive film;
    a fourth layer over the third layer, the fourth layer comprising a second organic compound doped with an electron-receiving material to the second organic compound; and
    a cathode over and in direct contact with the fourth layer, the cathode comprising a metal,
    wherein each of the second layer and the third layer has a single layer structure,
    wherein the transparent conductive film comprises a material selected from the group consisting of tin oxide, indium oxide, zinc oxide, zinc oxide containing gallium, and molybdenum oxide.

12. The light-emitting device according to claim 11, wherein the first organic compound is an electron-transporting material.

13. The light-emitting device according to claim 12, wherein the electron-transporting material is a metal complex having a ligand including a $\pi$-conjugated skeleton.

14. The light-emitting device according to claim 11, wherein the electron-supplying material is selected from an alkali metal, an alkali-earth metal, and a rare-earth metal.

15. The light-emitting device according to claim 11, wherein the second organic compound is a hole-transporting material.

16. The light-emitting device according to claim 15, wherein the hole-transporting material is a material having an aromatic-amine skeleton.

17. The light-emitting device according to claim 11, wherein the electron-receiving material is a metal oxide.

18. The light-emitting device according to claim 17, wherein the metal oxide is selected from molybdenum oxide, vanadium oxide, and rhenium oxide.

19. The light-emitting device according to claim 11, wherein the first layer has a multilayer structure.

20. The light-emitting device according to claim 11, further comprising a fifth layer between the anode and the first layer.

21. The light-emitting device according to claim 20, wherein the fifth layer comprises a hole-transporting material.

22. The light-emitting device according to claim 11, further comprising a filter on the side where light is extracted.

23. An electronic device of which display portion is equipped with the light-emitting device according to claim 11.

* * * * *